United States Patent [19]

Knuttel et al.

[11] Patent Number: 5,274,329
[45] Date of Patent: Dec. 28, 1993

[54] METHOD FOR RECORDING SPIN RESONANCE SPECTRA AND FOR SPIN RESONANCE IMAGING

[75] Inventors: Alexander Knuttel, Eggenstein-Leopoldshafen; Rainer Kimmich, Ulm, both of Fed. Rep. of Germany

[73] Assignee: Bruker Medizintechnik GmbH, Fed. Rep. of Germany

[21] Appl. No.: 646,788
[22] PCT Filed: Apr. 27, 1990
[86] PCT No.: PCT/DE90/00310
§ 371 Date: Mar. 11, 1991
§ 102(e) Date: Mar. 11, 1991
[87] PCT Pub. No.: WO90/13827
PCT Pub. Date: Nov. 15, 1990

[30] Foreign Application Priority Data

Apr. 29, 1989 [DE] Fed. Rep. of Germany ....... 3914301

[51] Int. Cl.⁵ ............................................. G01R 33/20
[52] U.S. Cl. .................................... 324/307; 324/300
[58] Field of Search ............... 324/307, 309, 308, 300; 128/653.2

[56] References Cited

U.S. PATENT DOCUMENTS

| | | | |
|---|---|---|---|
| 4,680,546 | 7/1987 | Dumoulin | 324/307 |
| 4,703,270 | 10/1987 | Hall et al. | 324/309 |
| 4,706,024 | 11/1987 | Dumoulin | 324/309 |
| 4,789,832 | 1/1988 | Nagayama | 324/307 |
| 4,922,203 | 5/1990 | Sillerud et al. | 324/309 |
| 4,972,147 | 11/1990 | Van Vaals | 324/309 |
| 5,081,417 | 1/1992 | Bovee et al. | 324/307 |
| 5,103,175 | 4/1992 | Kimmich et al. | 324/307 |
| 5,111,819 | 5/1992 | Hurd | 324/309 |
| 5,172,060 | 12/1992 | Knuttel | 324/307 |

FOREIGN PATENT DOCUMENTS 3445689 6/1986 Fed. Rep. of Germany .

OTHER PUBLICATIONS

Book Sanders "Modern NMR Spectroscopy 1987", Oxford University 1987, pp. 237-259.
BookWehrli, Felix W. Drek Shaw and J. Bruce Kneeland "Biomedical Magnetic Resonance Imaging," verlag Chemie, 1988, pp. 1-45, 521-545.
Journal of Magnetic Resonance 78 (1988) pp. 205-212.
Journal of Magnetic Resonance 81 (1989) pp. 333-338.
Journal of Magnetic Resonance 60 (1984), pp. 337-341.
Journal of Magnetic Resonance 78 (1988) pp. 355-361.
Journal Magnetic Resonance in Medicine 10 (1989), Jun., No. 3, pp. 404-410.
Journal Magnetic Resonance in Medicine 3 (1986), Apr. No. 2, pp. 282-288.
Journal Magnetic Resonance in Medicine 7 (1988), Jul., No. 3, pp. 364-370.
Journal of Magnetic Resonance 81 (1989), Feb. 15, No. 3, pp. 570-576.
Journal of Magnetic Resonance 67 (1986), p. 148.
Journal of Magnetic Resonance 68 (1986), p. 367.
Journal of Magnetic Resonance 77 (1988), p. 596.
Journal of Magnetic Resonance 72 (1987), p. 379.

Primary Examiner—Michael J. Tokar
Assistant Examiner—Raymond Y. Mah
Attorney, Agent, or Firm—Claude A. S. Hamrick

[57] ABSTRACT

A method serves for recording spin resonance spectra of test samples having at least three groups of spins. A first group is coupled to a second group, while a third group is uncoupled relative to the second group but has a spectral position, e.g. chemical shift, which is substantially identical only to that of the first group. For obtaining an isolated image of the signal of the first group, one suppresses the signal of the third group. A pulse sequence of three r.f. pulses (10, 13, 17) are irradiated upon the sample in a manner known as such. The second r.f. pulse (13) is applied in such a way that the magnetization of the spins of the first group and of the second group is transferred to a state of double-quantum coherence by coherence transfer. Then, a first magnetic gradient field pulse (15) of a predetermined pulse surface ($\epsilon_2$), with dephasing effect for the double-quantum coherence, is exerted upon the sample. The third r.f. pulse (17) is adjusted in such a way that the double-quantum coherence is retransferred, by coherence retransfer, to the single-quantum coherence, which is finally exposed to a second magnetic gradient field pulse (19), being rephasing for the spins of the first group (A) and having a pulse surface n times the pulse surface of the magnetic gradient field pulse (15).

17 Claims, 7 Drawing Sheets

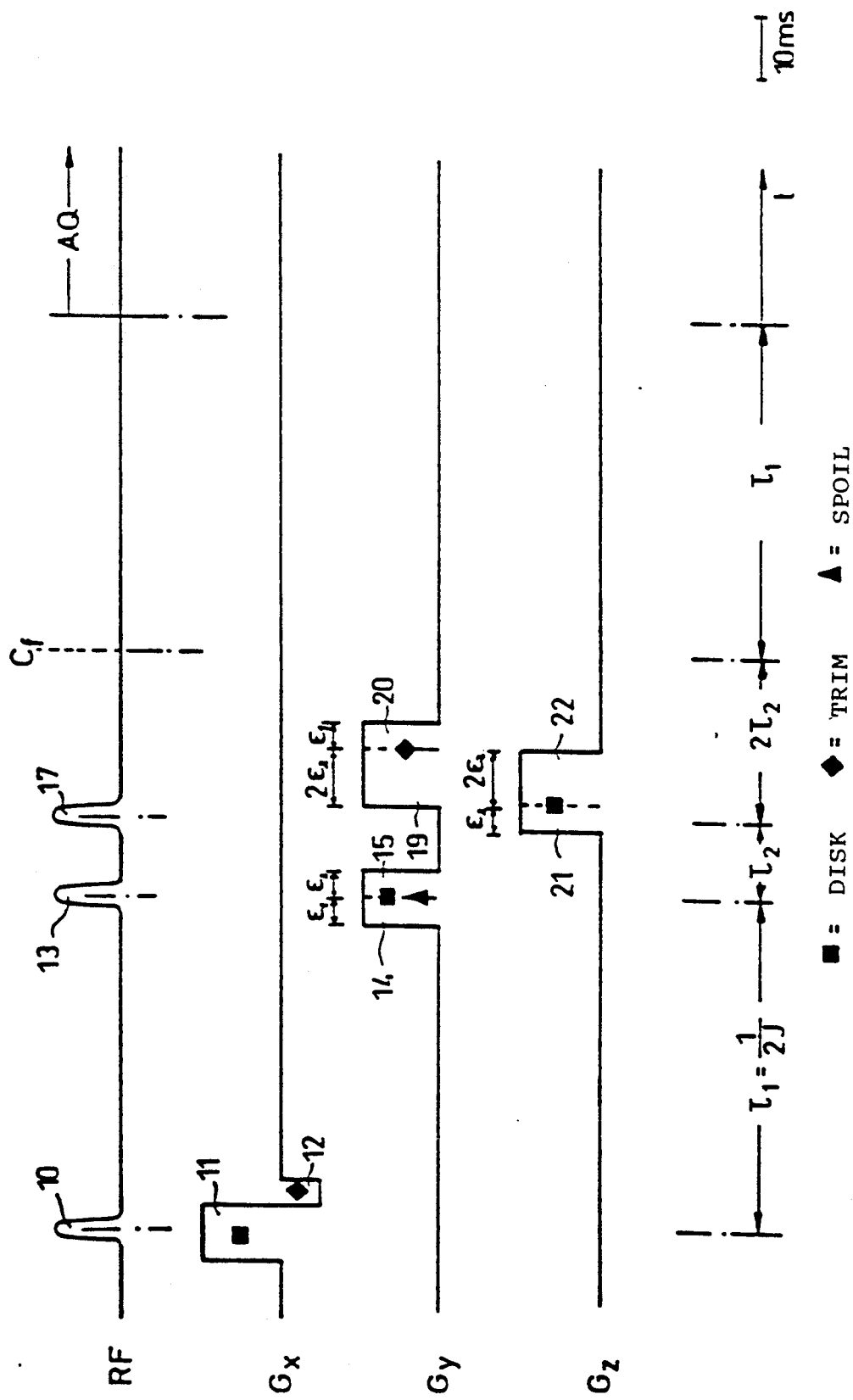

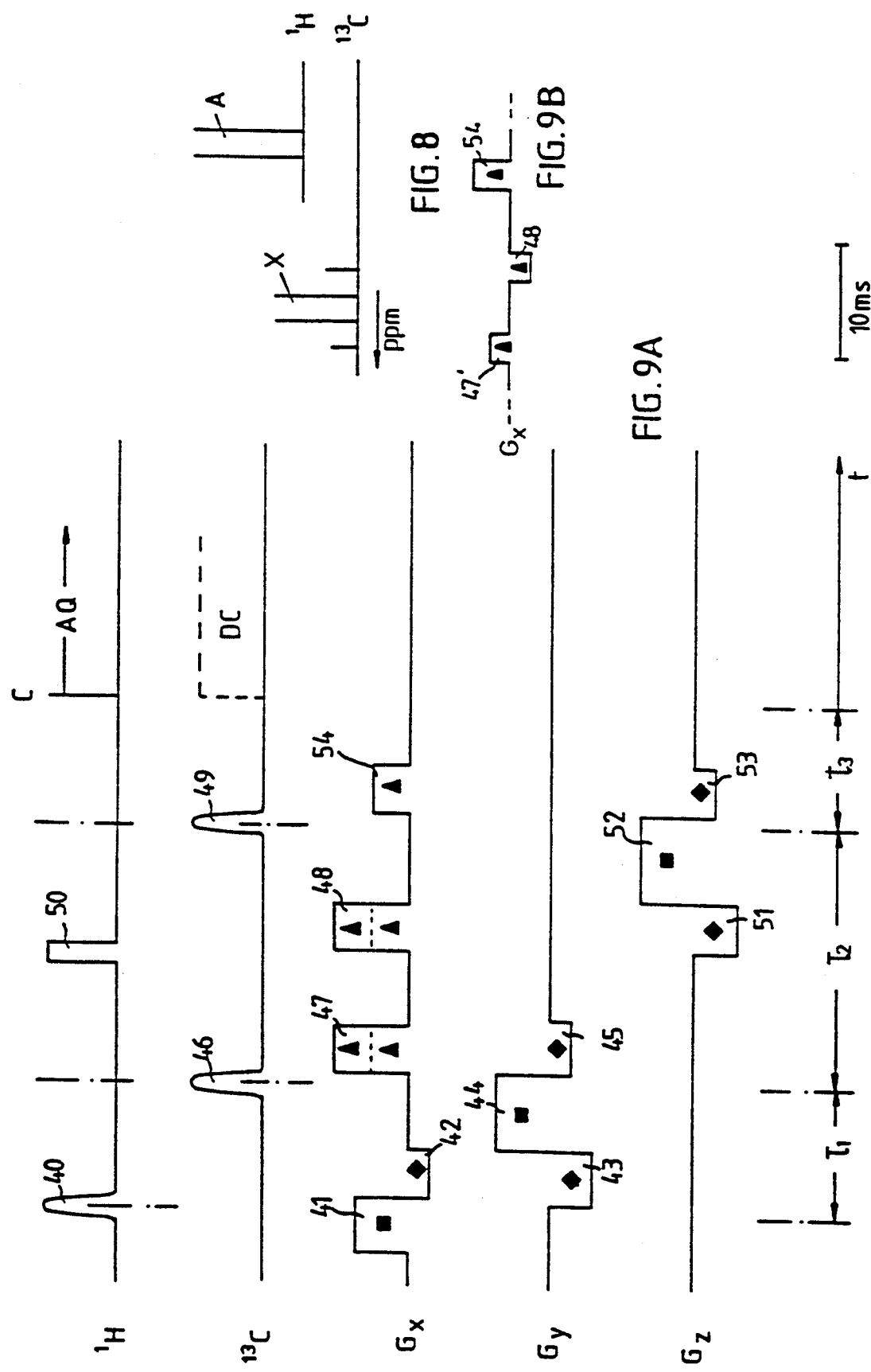

METHOD FOR RECORDING SPIN RESONANCE SPECTRA AND FOR SPIN RESONANCE IMAGING

The present invention relates to a method for recording nuclear resonance spectra and for spin resonance imaging of test samples having at least three groups of nuclei of the same kind, the first group being coupled to a second group, while a third group is uncoupled relative to the second group but has a chemical shift which is substantially identical only to that of the first group, the method comprising the step of suppressing the signal of the third group for the purpose of obtaining an isolated image of the signal of the first group.

Further, the invention relates to a method for recording nuclear resonance spectra of test samples having at least three groups of nuclei, a first group of the first kind of nuclei being coupled to a second group of a second kind of nuclei, while a third group of the first kind of nuclei is uncoupled relative to the second group, but has a chemical shift which is substantially identical only to that of the first group, the method comprising the step of suppressing the signal of the third group for the purpose of obtaining an isolated image of the signal of the first group.

Finally, the method relates generally to a method for recording spin resonance spectra of test samples having at least three groups of spins, the first group of them being coupled to a second group, while a third group is uncoupled relative to the second group but provides a signal having a spectral position substantially identical only to that of the first group, the method comprising the step of suppressing the signal of the third group for the purpose of obtaining an isolated image of the signal of the first group.

It has been known in practice in the field of spin resonance spectroscopy to "edit" spectra where signals of different groups of nuclei heterodyne one with the other. By "editing" one understands different recording techniques which allow to filter out individual signals from the heterodyning spectra. Usually, this is effected by carrying out series of several measurements using different measuring parameters, and eliminating thereafter the undesirable signal contents by subtraction.

Examples of such editing techniques for nuclear magnetic resonance applications have been described in the textbook entitled "Modern NMR Spectroscopy" by Sanders, Jeremy K. M. and Brian K. Hunter, Oxford University Press, 1987, pages 237 to 259. Other methods of this type are described by EP-OS 244 752 and EP-OS 166 559. In the case of these other known methods, uncoupled spins are suppressed by forming the difference between two measurements.

However, all of the techniques described above have the common disadvantage that for recording a single spectrum a plurality of measurements have to be performed successively in time, using different measuring parameters. While this presents no substantial problem to a laboratory in the case of durable chemical samples, considerable problems can result in cases where such nuclear magnetic resonance spectra are to be recorded on biological samples, i.e. on living tissue. This is true above all for in-vivo measurements to be carried out on patients where movement artefacts may lead to adulterations of the measured values.

In addition, subtracting measuring methods are connected with the fundamental drawback that the subtraction of high noise signal amplitudes may give rise to measuring errors which may be in the same range of magnitude as the useful signal.

According to other known methods, nuclear magnetic resonance spectra are recorded in a volume-selective way, i.e. only for a limited, geometrically defined area of a sample. This recording technique has gained particular importance in the fields of biological research and medicine. For, this recording technique enables, for example, a nuclear magnetic resonance spectrum to be recorded for a given, defined point in an inner organ of a patient.

The technique of recording volume-selective nuclear magnetic resonance spectra has been known as such. Examples of this technique are found in the textbook entitled "Biomedical Magnetic Resonance Imaging" by Wehrli, Felix W., Derek Shaw and J. Bruce Kneeland, Verlag Chemie, 1988, pages 1 to 45 and 521 to 545.

Other known methods are, for example, the so-called SPARS method, which has been described by the U.S. publication "Journal of Magnetic Resonance", 67 (1986), page 148, and the so-called DIGGER method, described by the U.S. publication "Journal of Magnetic Resonance", 68 (1986), page 367. These known methods are volume-selective methods where the layers outside the selective volume area are saturated so that only the selected volume area is left. However, it is a disadvantage of these two known methods, in particular of the DIGGER method, that they require high r.f. power and that the pre-saturation r.f. pulses must be tuned very exactly in both methods as otherwise additional signals may be generated.

Another special method for volume-selective imaging of nuclear magnetic resonance spectra using three 90° r.f. pulses spaced in time, while applying simultaneously different magnetic gradient field pulses in different coordinate directions, has been described for example by DE-OS 34 45 689. In the case of this known method, conventional stimulated spin echoes are produced.

Other similar methods have been known from U.S. Pat. Nos. 4,680,546, and, 4,703,270 and U.S. publication "Journal of Magnetic Resonance", vol. 78, pages 205 to 212; vol. 81, pages 333 to 338; vol. 60, pages 337 to 341, and vol. 78, pages 355 to 361.

Now, when the nuclear magnetic resonance spectrum of a homonuclear or heteronuclear coupled spin system of the general form $A_n X_m$ is to be recorded—this is of great interest in biomedical research as such measurements permit to draw conclusions regarding the metabolism in organic tissue—one frequently encounters the problem of over-lapping signals. In the case of a homonuclear coupled spin system, both coupling partners consist of one and the same kind of nuclei, for example of protons ($^1H$), while in the case of heteronuclear coupled spin systems the coupling partners belong to different kinds of nuclei, for example the A group may be protons ($^1H$) while the X group may be a carbon isotope ($^{13}C$). If one regards lactate, a $A_3 X$ system, as a homonuclear example, the methyl group ($CH_3$), has substantially the same chemical shift, i.e. line position in the spectrum, as the $CH_2$ group of lipid, both chemical shifts being in the range of 1.35 ppm. Given the fact, however, that the lipid concentration may be considerably higher in living tissue, the $CH_2$ signal of the lipid will mask the $CH_3$ signal of the lactate. The same applies by analogy to any editing of heteronuclear $A_n X_m$ systems, for example to an $A_3 X$ system such as methanol with a $^{13}C$ enrichment.

Now, if in the case of the first-mentioned example a volume-selective lactate measurement were carried out in a lipid environment, using the known editing techniques where, as has been mentioned before, two measurements have to be performed successively in time using different parameters, problems would be encountered if the patient should move during the two measurements. For, any such movement would give rise to artefacts, which would influence the measurements differently so that it would be necessary, during the subsequent subtracting process, to work out, by suitable editing, not only the desired isolated $CH_3$ signals of the lactate, but also the undesirable lipid artefacts.

Although the invention will be explained for the purposes of the present invention by way of an application chosen from the nuclear magnetic resonance (NMR) field, it is understood that it can be applied also in connection with other forms of spin resonance, in particular electron paramagnetic resonance (EPR) or nuclear/electron double resonance techniques (ENDOR, ELDOR, NEDOR, Overhauser, etc.).

Further, although the invention will be described using the simple example of scalar coupling (J) it is understood that it is suited also for application in connection with other coupling types, for example, dipole coupling.

Now, the present invention has for its object to improve a method of the before-mentioned type in such a way as to enable volume-selective measurements to be carried out on biological samples, in particular on patients, using a single pulse sequence.

The invention achieves this object, in the case of the first-mentioned method for recording nuclear resonance spectra on homonuclear systems, by a process wherein a pulse sequence of three r.f. pulses, preferably 90° r.f. pulses, is irradiated upon the sample, the second r.f. pulse is applied in such a way that the magnetization of the nuclei of the first group and of the second group is transferred to a state of double-quantum coherence by coherence transfer, a first magnetic gradient field pulse of a predetermined pulse surface, with dephasing effect for the double-quantum coherence, is exerted upon the sample in the time interval between the second r.f. pulse and the third r.f. pulse, the third r.f. pulse is adjusted in such a way that the double-quantum coherence is retransferred to a state of single-quantum coherence of the nuclei of the first group, by coherence transfer, and thereafter a second magnetic gradient field pulse, being rephasing for the nuclei of the first group and having a pulse surface twice as large as that of the first magnetic gradient field pulse, is exerted upon the sample.

In the case of the second before-mentioned method for recording nuclear resonance spectra on heteronuclear systems, the object underlying the invention is achieved, on the one hand, by a process wherein a pulse sequence of four r.f. pulses, preferably three 90° r.f. pulses and one 180° r.f. pulse, is irradiated upon the sample, the second r.f. pulse is applied in such a way that the magnetization of the nuclei of the first group belonging to the first kind of nuclei is transferred to a state of multiple-quantum coherence by coherence transfer, at least a first magnetic gradient field pulse of a predetermined pulse surface, with dephasing effect for the multiple-quantum coherence, with respect to the second group, is exerted upon the sample in the time interval between the second r.f. pulse and the fourth r.f. pulse, a third r.f. pulse, with refocusing effect for the multiple-quantum coherence, with respect to the first group, is irradiated upon the sample in the interval between the second r.f. pulse and the fourth r.f. pulse, the fourth r.f. pulse is adjusted in such a way that the multiple-quantum coherence is retransferred to a state of single-quantum coherence of the nuclei of the first group, by coherence transfer, and thereafter a second magnetic gradient field pulse, being rephasing for the nuclei of the first group, is exerted upon the sample.

Further, with respect to the general spin resonance case, the object underlying the invention can be achieved by a process wherein a pulse sequence of at least three r.f. pulses, preferably 90° r.f. pulses, are irradiated upon the sample, at least the second r.f. pulse is applied in such a way that the magnetization of the spins of the first group is transferred to a state of multiple-quantum coherence by coherence transfer, at least one first magnetic gradient field pulse having a predetermined pulse surface, with dephasing effect for the multiple-quantum coherence, is exerted upon the sample following the second r.f. pulse, at least another one of the r.f. pulses is adjusted in such a way that the multiple-quantum coherence is then retransferred to the single-quantum coherence by coherence transfer, and finally a second magnetic gradient field pulse, with rephasing effect for the spins of the first group, is exerted upon the sample, whose pulse surface is k times the pulse surface of the first magnetic gradient field pulse, k being preferably the quotient of the gyromagnetic ratios of the involved spins.

These measures solve the object underlying the invention fully and perfectly. For, the invention makes use of an artifice insofar as the magnetization of the first group of nuclei of interest is transferred by coherence transfer, for a specific time interval, to another quantum state. The double-quantum coherence or multiple-quantum coherence is coded by defined dephasing, in order to be retransferred thereafter from the second group to the first group, by coherence transfer, and to be rephased, i.e. decoded, in the same defined manner, while the disturbing signal of the third group, which had remained in the previous spectral range, is suppressed during that same period of time.

It is thus possible to perform defined dephasing to a double or multiple-quantum state, by means of a predetermined pulse surface of the magnetic gradient field pulse, whereafter rephasing to the single-quantum state can take place in the same defined manner when the pulse surface is varied in proportion to the gyromagnetic ratios.

To say it in other words: The information of interest, namely the magnetization of the nuclei of the first group, is transferred for a short period of time to a double-quantum or multiple-quantum state, and is coded by dephasing, in order for the information of interest to be retransferred, while thereafter the group of interest, namely the first group, is rephased (decoded) whereby the signals of the third group, which is of no interest in the experiment, are extinguished, as their spins will not be rephased due to the changed pulse surface. This is possible because only nuclei of interest, i.e. the first group, are coupled to the second group and because only the signals of that group are not extinguished.

In this connection, two aspects have to be considered:

a) Weighting of the dephasing through the order of multiple-quantum coherence:

One proceeds in this case from the known fact that the dephasing effect of a field gradient, i.e. a magnetic gradient field pulse, rises for a multiple-quantum coherence by the proportion which the sum frequency bears to the multiple-quantum frequency. In the homonuclear case this means in particular that an n-quantum coherence will dephase during a predetermined time interval ten times the amount of dephasing encountered in a single-quantum case. The first embodiment of the method according to the invention, therefore, provides for inverse weighting of the rephasing and dephasing gradients. Then, it is a precondition for rephasing of the single-quantum coherence to be detected that dephasing to a state of multiple-quantum coherence has taken place. As this can be true only for coupled spins, but never for uncoupled spins which on principle cannot develop multiple-quantum coherences, the signals of the latter will be suppressed.

b) Weighting of the dephasing through the gyromagnetic ratio:

In this case, the effect of a field gradient on coherences depends on the gyromagnetic ratio. In the heteronuclear case, multiple-quantum coherences involve the gyromagnetic ratios of all nuclei participating in the multiple-quantum coherence. In the case of this embodiment of the method according to the invention, one now compensates the dephasing effect with respect to one kind of nuclei (for example the spins of the first group A) by a refocusing pulse so that the dephasing phenomenon in the multiple-quantum coherence interval is determined solely by the gyromagnetic ratio of the heteronuclei of the second group, while the rephasing phenomenon in the subsequent single-quantum coherence interval takes place according to the gyromagnetic ratio of the other kind of nuclei. Weighting the dephasing and rephasing field gradients in inverse proportion to the active gyromagnetic ratios leads to selective refocusing of the heteronuclear coupled spins. In other words, the pulse area of the second magnetic gradient field pulse is optimally 1/k times the pulse area of the first magnetic gradient field pulses, where k is the gradient of the gyromagnetic ratios of the nuclei of the two kinds of nuclei. In particular, any coherences of the uncoupled spins, which on principle cannot develop multiple-quantum coherences, will not be refocused so that corresponding signals will be suppressed.

In consequence this means that the desired edited signal can be obtained already by a single pass so that any movement artefacts, for example, cannot make themselves felt in a disturbing manner. On the other hand, it is of course also possible to record several cycles in series in order to obtain, in the usual manner, an increase in signal-to-noise ratio, or to eliminate phase errors by the application of known techniques using cyclical phase shifting. But this has nothing to do with the fact that, basically, the entire edited spectrum is recorded already with the aid of a single pulse sequence. Since, as has been mentioned before, the method according to the invention makes use of the different relationships of the first and third groups of nuclei to the second group, with respect to chemical shift and coupling, the disturbing signals of the third group are completely suppressed.

In contrast to the methods known, for example, from DE-OS 34 45 689, coherent-transfer spin echoes are generated in the case of the present invention, instead of the conventional stimulated spin echoes.

According to a preferred embodiment of the method according to the invention, for disk-selective or volume-selective imaging, the sample is exposed in a conventional manner to a sequence of magnetic gradient field pulses of different coordinate directions, and at least one to three of the r.f. pulses are adjusted in a disc-selective manner.

These features provide the advantage that selective measurements can be performed on defined areas inside a sample, for example inside a living human body. It is thus possible to perform aimed measurements on inner organs of patients.

According to another preferred embodiment of the method according to the invention, using homonuclear coupled systems, the method is carried out on lactate samples.

This application is one of particular importance in biomedicine.

A preferred improvement of the before-described method according to the invention provides that prior to irradiating the first 90° r.f. pulse, one exposes the sample to a r.f. pre-saturating pulse selective for the nuclei of the second group, and thereafter to a magnetic gradient field pulse that is dephasing for those nuclei.

This feature provides the advantage to suppress disturbing signals, for example those of water, which are found in the immediate neighborhood of the second group, with respect to the chemical shift. These measures have no influence on the subsequent quantum transfer and quantum re-transfer, suppressing only coherences which anyway are not observable.

According to another preferred embodiment of the method according to the invention, the first and the second magnetic gradient field pulses are positioned at the time axis, relative to the r.f. pulses, in such a way that no stimulated echoes of uncoupled spins are generated.

This measure provides the advantage that any stimulated echo, resulting from undesirable uncoupled spins that might be refocused through the second and third 90° r.f. pulses, are dephased again as such undesirable refocusing would be encountered only for a symmetrical area, i.e. the product of intensity and length of the magnetic gradient field pulses relative to the r.f. pulses.

Generally, it can be said that other advantages result from the method according to the invention, such as the phase-independence of all pulses which results from to the fact that the magnetization can be dephased by magnetic gradient field pulses before every second and third 90° r.f. pulse. Further, the value of the r.f. field strength of the r.f. pulses has no notable effect on the measuring result, but may at the most lead to a certain signal loss so that the method according to the invention can be used also with surface coils. Finally, the length of the time interval selected between the first and the second 90° r.f. pulses and between the third 90° r.f. pulse and the beginning of the specrum-recording step is also uncritical because any deviation from the theoretical value of $1/(2J)$ for the $A_n$ X-system, or $1/(4J)$ for the $A_n$ $X_2$-system would lead to a certain signal loss only if the transversal relaxation times $T_2$ are much longer than the pulse sequence. For shorter relaxation times $T_2$, however, shorter time intervals may be preferable.

Finally, it is understood that other advantages may be achieved by combining the method according to the invention with other, conventional measures including, for example, recording of the complete echo in time-symmetry around the point located at the time interval $\tau_1$ after the third 90° r.f. pulse.

Further, it is possible, by varying the magnetic gradient field pulses and by superimposing a read gradient upon the echo, with subsequent Fourier transformation, to generate an image of a two-dimensional or three-dimensional area. Due to the four pulses used, it is also possible in this case to image a partial area of the object under examination with higher resolution, for example when carrying out in-vivo measurements on a human organ. Further, it is possible to apply one of the two r.f. pulses for the second group in a selective way, with respect to the chemical shift, in order to achieve chemical shift imaging. The method according to the invention is also suited for being integrated into known imaging methods, for example the 2D-FT method with phase and read gradient, or the back-projection method using read gradients under variable angles, or else the chemical-shift imaging method, i.e. high-resolution spectroscopy using two phase gradients (without a read gradient).

Other advantages of the invention will appear from the specification and the attached drawing.

It is understood that the features that have been described before and will be explained hereafter may be used not only in the described combinations, but also in any other combination, or individually, without leaving the scope and intent of the present invention.

One embodiment of the invention will now be described in more detail with reference to the drawing in which:

FIG. 3 shows a pulse program illustrating one embodiment of the method according to the invention applied to a homonuclear coupled system;

FIG. 8 shows a representation similar to that of FIG. 1, but for a heteronuclear coupled system;

FIG. 9A shows a pulse program, illustrating an embodiment of the method according to the invention for heteronuclear coupled systems;

FIG. 9B shows a variant of the pulse program illustrated in FIG. 9A;

Figure 1:
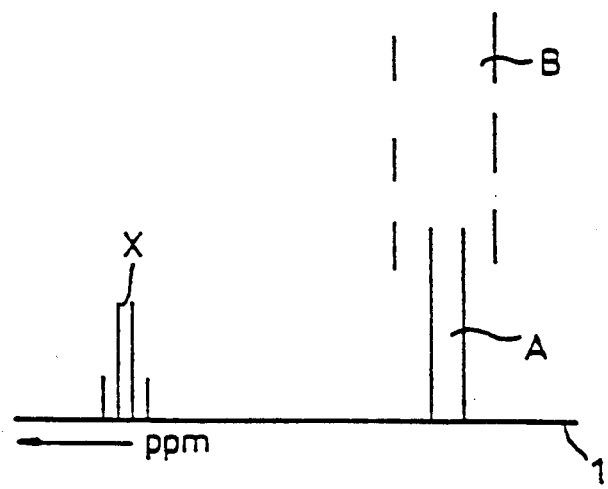
FIG. 1 shows a very diagrammatic representation of a nuclear resonance spectrum of a homonuclear coupled $A_3$ X system, namely that of lactate ($CH_3$—CH(OH)—COOR)

FIG. 1 shows, in a very diagrammatic way, on a baseline 1, a nuclear resonance spectrum of lactate, a system with J coupling between the protons of the $CH_3$ group (A line at 1.35 ppm) and the proton of the CH group (X line at 4.1 ppm). The A line of the $CH_3$ group of the lactate is masked by the much more intensive B line of the $CH_2$ group of the surrounding lipid because the lipid concentration of biological samples is often much higher.

Figure 2:
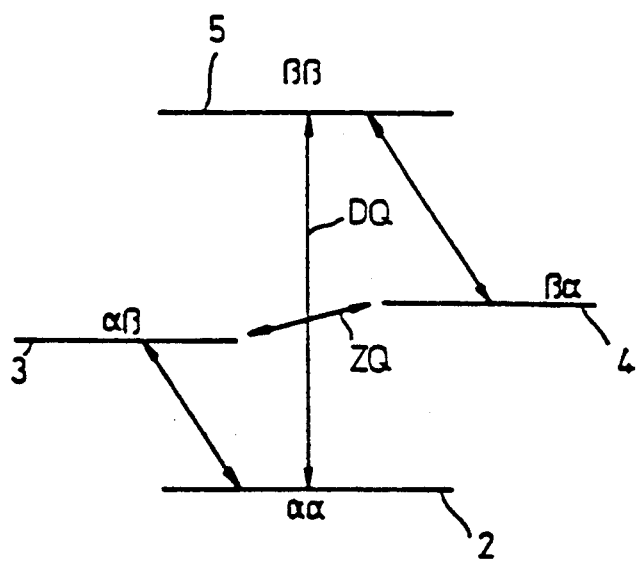
FIG. 2 shows a diagram illustrating multiple-quantum transitions by way of an AX system.

FIG. 2 shows, in diagrammatic manner, four energy levels 2, 3, 4, 5 of different height. The energy level 2 corresponds to the quantum state $\alpha\alpha$, the energy level 3 corresponds to the quantum state $\alpha\beta$, the energy level 4 corresponds to the quantum state $\beta\alpha$, and the energy level 5 corresponds to the quantum state $\beta\beta$. The single-quantum transitions take place between the energy levels 2 and 3, and 4 and 5, which manifests itself in the spectrum in the form of a doublet.

In addition, double-quantum transitions (DQ) take place immediately between the energy levels 2 and 5, and zero-quantum transitions (ZQ) take place between the energy levels 3 and 4. Although these DQ and ZQ quantum transitions cannot be observed technically, they nevertheless exist and will be utilized for selecting different coherence paths, as will be explained in greater detail below.

Now, it is intended to work out from the heterodyned spectrum the A line by suitable editing. This is achieved with the pulse program illustrated in FIG. 3. The pulse program serves for performing a volume-selective measurement, it being understood, however, that the method according to the invention is not limited to volume-selective measurements.

The upper line of the pulse program of FIG. 3 shows r.f. pulses, this term being used in nuclear resonance technique to describe pulsed r.f. signals of a defined envelope contour. One distinguishes between so-called "soft pulses", i.e. pulses of relatively long duration and relatively low amplitude, and so-called "hard pulses", i.e. such of relatively short duration and high amplitude. In addition, one distinguishes between selective and non-selective pulses, depending on whether the envelope curve of the pulses results in a narrow or a wide frequency spectrum.

On the three middle lines of the pulse diagram of FIG. 3, magnetic gradient field pulses $G_x$, $G_y$ and $G_z$ have been plotted for the three coordinate directions x, y and z. The pulses marked in FIG. 3 by the symbol "■" are so-called "disk gradients", i.e. gradient pulses serving to select a disk in space, while the pulses marked by the symbol "♦" are so-called "trim gradients", i.e.

gradients preceding or following the disk gradients and serving to focus the coherence. The pulses marked by the symbol "▲" finally represent so-called "spoil gradients" with the aid of which it is possible to dephase or rephase specific coherences, and to extinguish or restore thereby their magnetization, as a signal.

It is understood that the magnetic gradient field pulses may be velocity- and acceleration-compensated in the manner known as such, for example from U.S. publication "Journal of Magnetic Resonance", 77 (1988), page 596.

It is now possible, in the case of the method according to the invention to proceed in the conventional manner, i.e. to apply initially, before the beginning of the pulse sequence according to FIG. 3, a so-called r.f. pre-saturation pulse or a corresponding dephasing gradient, or both, in order to extinguish the magnetization of the X group and of possible other disturbing signals, for example those of water, so that they can be neglected during the further process.

However, the inventive method proper commences with the first r.f. pulse, preferably a 90° r.f. pulse 10 which is irradiated upon the sample in the x direction during the action of the first disk gradient 11, followed by a trim gradient 12.

The first 90° r.f. pulse 10, just as the other 90° r.f. pulses which will be described further below, is a so-called soft pulse having, for example, an envelope curve sinx/x and a disk-selective effect in the x, y or z direction in the presence of a magnetic field gradient. The first 90° r.f. pulse 10, just as the other 90° r.f. pulses which will be described further below, has no selective effect as regards the chemical shift.

The pulse angles of the 90° r.f. pulses are relatively uncritical, except that the pulse angle must be greater than 0°. For example, the first "90°" r.f. pulse may be set as a so-called "ERNST" angle which is smaller than 90°. This angle permits short repetition times in imaging processes.

Further, the first 90° r.f. pulse 10 can be replaced by a pulse sequence advanced in time and consisting of a 90° r.f. pulse and a 180° r.f. pulse selective for the A magnetization, in order to suppress any disturbing signals, for example those of water, even more efficiently.

Due to the first 90° r.f. pulse 10, the entire magnetization of the A and X nuclei shifts to the x-y plane, although this naturally can be true for the X magnetization only on the condition that it had not been extinguished before in the manner just described.

The magnetization of the A group, i.e. for example that of the methyl group of lactate ($A_3X$ system) now evolves during the following time interval $\tau_1$ under the influence of the J coupling effect, the general relationship for an $A_nX$ system, in response to the transversal relaxation time $T_2$, being:

$$\tau 1 = \frac{1}{\pi J} \text{arc cot}\left(\frac{1}{\pi J T_2}\right)$$

Thus, the following applies to this term: $\tau_1 \leq 1/(2J)$ or an odd multiple thereof.

Correspondingly, the following formula applies for an $A_n X_2$ system:

$$\tau 1 = \frac{1}{2\pi J} \text{arc cot}\left(\frac{1}{2\pi J T_2}\right)$$

Now, an antiphase magnetization evolves. In the case of lactate, J is for example equal to 7.35 Hz, so that the time interval $\tau_1$ is set to 68 ms.

At the end of the time $\tau_1$, a second 90° r.f. pulse 13 is irradiated upon the sample, while at the same time a disk gradient 14 and/or a spoil gradient 15 is exerted on the sample in the y direction. The pulse surface of the spoil gradient 15 has a defined size; in FIG. 3 it is indicated by pulse width $\epsilon_2$. By the second 90° r.f. pulse 13, the magnetization of the A group—to say it in more general terms—is transferred approximately ¼ by polarization transfer, ¼ to a double-quantum coherence and another ¼ to a zero-quantum coherence (in the case of experiments with heteronuclear coupled spin systems, by multiple-quantum transfer). In the context of the invention that will be described in the following application, we will observe only that content which is transferred by coherence transfer. The portion of ¼ which is transferred by polarization transfer will be discussed in a parallel U.S. patent application Ser. No. 646,787 filed Mar. 11, 1991 filed by the same applicant. The disclosure content of that application is incorporated by reference in the present application.

The second 90° r.f. pulse 13 has the effect that the antiphase magnetization of the A group, and only this, is transferred from its single-quantum state to a double-quantum state by coherence transfer, this being possible due to the J coupling between the A group and the X group (CH) at a given chemical shift, while the B magnetization cannot be transferred, for lack of corresponding coupling. The resulting double-quantum coherence is a phenomenon which cannot be observed directly. For further details regarding the quantum transfer theory, reference is made to the before-mentioned book by Sanders, loc.cit., pages 121 et seq.

Due to the double-quantum state, the coherence evolves at the double resonance frequency. This, together with the defined pulse length $\epsilon_2$ of the spoil gradient 15, leads to defined, i.e. coded dephasing of the double-quantum coherence. The arbitrary phase, as defined by the r.f. pulses 10 and 13, relative to the third 90° r.f. pulse 17, is without any influence on the latter so that disk selection is rendered possible in the z direction.

A third 90° r.f. pulse 17, effecting the retransfer of the double-quantum state to the single quantum-state of the A group, is then irradiated upon the sample at a time interval $\tau_2$ to the second 90° r.f. pulse 13. The time interval $\tau_2$ between the second r.f. pulse 13 and the third r.f. pulse 17 is adjusted as short as possible for this purpose.

During the following $\tau_1$ interval, the retransferred magnetization now evolves to an in-phase magnetization which after the moment C, where an echo maximum is encountered, can be recorded and imaged, during a recording interval AQ, as free induction decay (FID) using known Fourier processing methods. Preferably, only the "right" side of the echo is recorded, i.e. beginning at the moment C.

Following the third 90° r.f. pulse 17, a trim gradient 19, 20 is exerted upon the sample in the y direction, and a disk gradient 21, 22 is exerted in the z direction.

This has the effect that the A magnetization is rephased in a defined manner, i.e. decoded, by the spoil gradient 19. The pulse length of the trim gradient 19 of $2\epsilon_2$ is twice as long as the pulse length $\epsilon_2$ of the spoil gradient 15. This has the effect that the A spins which now spin again at single precession frequency, in the single-quantum state, and only these, are rephased, i.e. decoded in a defined way, while the B spins, which are dephased in this time interval, having a pulse length of $2\epsilon_2$, and which had been spinning during the time interval $\tau_2$ at single precession frequency in their single-quantum state, are not rephased now.

Upon completion of the quantum retransfer by the third 90° r.f. pulse 17, and rephasing of the A magnetization by the trim gradient 19 of double-length $2\epsilon_2$, there exists only a measurable magnetization of the A group at this point of the spectrum, which can then be evaluated in the known manner, while any stimulated echoes that may still be encountered are suppressed by the trim gradient 19.

For, as can be seen in FIG. 3, the gradient pulses act asymmetrically to the 90° pulses 13 and 17, so that no undesirable refocusing of other uncoupled spins can occur, this being prevented by the asymmetrical arrangement of the gradient pulses in the two $\tau_1$ intervals.

FIG. 3 further shows that the influence of the chemical shift and of magnetic field inhomogeneities on the A magnetization, during the duration of the first $\tau_1$ interval, can be reversed during the second $\tau_1$ interval by the two 90° pulses 13 and 17, which can be imagined as being a single 180° pulse.

Figure 4:
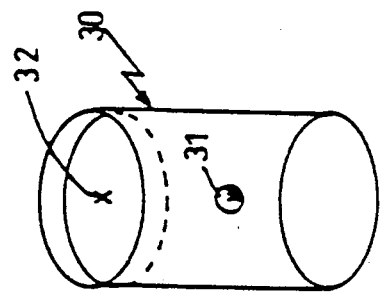
FIG. 4 shows a representation of a first test sample, for verifying the properties of the embodiment of the method according to the invention.

The function and effect of the pulse program illustrated in FIG. 3 was verified experimentally by the following tests, among others:

FIG. 4 shows diagrammatically a sample 30, with a ball 31 having a volume of approx. 1 cc and containing a mixture of 50% of pure acetate and 50% of pure lactate in a water environment 32.

Figure 5:
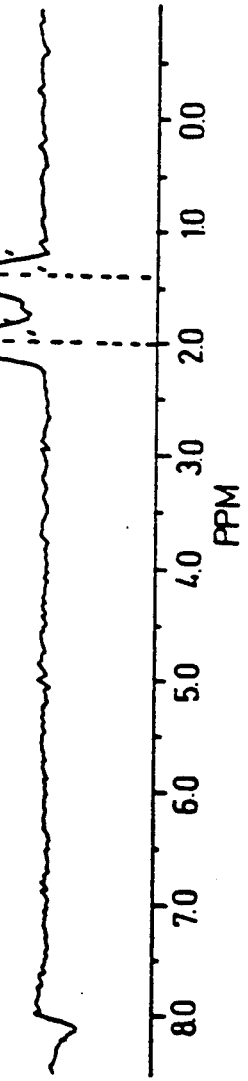

FIG. 5 shows in this connection a spectrum recorded by a prior-art method where a disturbing acetate line can be seen at approx. 2.0 ppm beside the lactate line at approx. 1.35 ppm. The measurement was effected using a pulse sequence similar to that described in U.S. publication "Journal of Magnetic Resonance", 72, 1987, on page 379. The magnetic field strength employed was 4.7 T.

Figure 6:
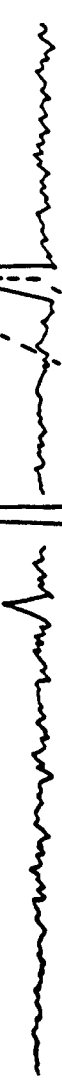

In contrast, FIG. 6 represents a measurement taken with the aid of the method according to the invention using a pulse program according to FIG. 3, with otherwise unchanged experimental conditions, except that a scaling factor of 4 was used for signal imaging. FIG. 6 shows very clearly that, given due regard to this scaling factor, the CH₃ signal at 1.35 ppm is approximately as high as in the spectrum of FIG. 5, while the uncoupled spins of the acetate have practically disappeared.

Figure 7:
FIGS. 5-7 show nuclear resonance spectra recorded on a sample according to FIG. 4.

FIG. 7 shows a check measurement which was intended to verify the volume selectivity of the method according to the invention.

The three-dimensional set-up of the sample used for the measurement of FIG. 7 was identical to that illustrated in FIG. 3, but the ball 31 consisted of pure acetate, while the surrounding 32 consisted of pure lactic acid.

It can be clearly seen in FIG. 7 that the measurement is in fact selective, because only the volume area of the ball 31 was measured, the uncoupled spins of the acetate being suppressed by the method according to the invention, whereas no CH₃ signal of the lactate was recorded since no lactic acid is present at the place—and only at the place—of the ball 31.

The before-described methods for measuring nuclear spin resonance spectra on homonuclear coupled spin systems are based on the following theory:

The reduced equilibrium density operator in an $A_n X$ system is defined as follows by high-temperature approximation:

$$\delta(0) = \sum_{k=1}^{n+1} I_{kz}$$

wherein $I_1, I_2 \ldots, I_n$ belong to the A group, in the case of the $A_3$ system (lactate), this is for example the CH₃ group and $I_{n+1}$ corresponds to the X group, for example the CH group in the case of the $A_3X$ system (lactate).

After application of the first 90° r.f. pulse 10 (x phase), the equilibrium density operator is defined by the following formula, $I_{n+1}$, i.e. the X group having been eliminated by saturation, for the sake of simplicity:

$$\delta = \sum_{k=1}^{n+1} -I_{ky}$$

Following the first evolution interval $\tau_1 = 1/(2J)$, the following relationship is obtained, including the dephasing gradients which impress upon the spins a phase $\Phi$ depending on positioning (it be assumed that this phase is very much more important than the chemical shift so that this can be neglected):

$$\delta = \sum_{k=1}^{n} [2 I_{kx} I_{(n+1)z} \cos \Phi_1 + 2 I_{ky} I_{(n+1)z} \sin \Phi_1]$$

If any more complex additional terms should arise, these can be neglected because they are practically unobservable, or will practically not occur at all due to additional pre-saturation of the X group (for example water).

The second 90° r.f. pulse 13, which may have an y phase, but may also have any other phase, effects the double-quantum transfer, i.e. the transfer of the A magnetization to an unobservable double-quantum coherence, the zero-quantum coherence being eliminated by the application of gradients. Now, the following formula applies:

$$\delta = \sum_{k=1}^{n} -\frac{1}{2} [2 I_{kx} I_{(n+1)y} + 2 I_{ky} I_{(n+1)x}] \cos \Phi_1$$

Following the dephasing gradient 14, 15 in the time interval $\tau_2$, the following applies:

$$\delta = \frac{1}{2} \sum_{k=1}^{n} [2 I_{kx} I_{(n+1)y} + 2 I_{ky} I_{(n+1)x}] \cos \Phi_1 \cos (2\Phi_2)$$

All terms that do not contribute to the signal have been left away in this formula.

The third 90° r.f. pulse 17 (x phases) now effects a double-quantum retransfer of the X magnetization to an observable antiphase A magnetization:

$$\delta = -\frac{1}{2} \sum_{k=1}^{n} 2 I_{kx} I_{(n+1)2} \cos \Phi_1 \cos(2\Phi_2)$$

During the last $\tau_1$ interval ($\tau_1$ being equal to $1/(2J)$), the A antiphase magnetization is transferred to an inphase magnetization. At the same time, the dephasings effected during the preceding intervals are reversed:

$$(\delta) = \frac{1}{\pi^2} \int_0^\pi \int_0^\pi \ldots d\Phi_1 \, d(2\Phi_2)$$

wherein $$(\delta) = \frac{1}{8} I_{ky}$$

which shows that the signal loss amounts to approx. $\frac{1}{8}$, as compared to a fictitious measurement with free induction decay (FID).

The above consideration can be applied, by analogy also to spins where $I > (\frac{1}{2})$.

FIG. 8 is a representation similar to that of FIG. 1 illustrating a heteronuclear coupled system. Such heteronuclear coupled spin systems may be, for example, spin systems of glucose, glycogen or $^{13}C$-enriched natural substances or medicines, which are of great interest in biomedical research, these systems permitting conclusions to be drawn on the metabolism in organic tissue.

In the case of the variants of the method according to the invention that have been discussed above, as applied to homonuclear coupled systems, the polarization transfer and the polarization retransfer took place within the same kind of nuclei, typically protons.

In contrast, the variants of the method according to the invention that will be discussed hereafter are applied to heteronuclear coupled systems where couplings occur between different kinds of nuclei, taking protons ($^1H$) and $^{13}C$ as examples. The excitation and signal reception on the proton side are such as to yield maximum signal intensity. However, it is necessary for this purpose to completely suppress great signal contents of uncoupled spins, such as water, fat or the main lines in the presence of natural $^{13}C$ (1%) in order to be able to detect indirectly the J-coupled $^{13}C$ satellites.

The pulse sequence described in connection with FIG. 9A enables heteronuclear coupled spin systems on the proton side to be edited, i.e. worked out, while at the same time the disturbing coupled and uncoupled signals are completely suppressed.

The representation of FIG. 9A is completely identical to that of FIG. 3, with respect to the symbols used, except that two axes $^1H$ and $^{13}C$ for the two kinds of nuclei have been added on the radio-frequency side.

FIGS. 8 and 9A will now be discussed using the $^{13}C$-enriched test substance methanol, an $A_3 X$ system, as an example, where a J coupling exists between the protons of the $CH_3$ group (A line at 3 ppm) and the $^{13}C$ nucleus (X line at 50 ppm). The heteronuclear J coupling of the biologically interesting substances is approximately equal to $J = 141$ Hz, as in the case of methanol, which according to the before-discussed formula leads to a value of $\tau_1 = 10.7$ ms for the time interval $\tau_1$ in the case where $\tau_1 = 3/(2J)$.

As has been mentioned before, the signal, namely the A doublet, is detected in the case of this variant of the method on the proton side where the three protons present lead additionally to a higher signal intensity as compared to the $^{13}C$ side where only one nucleus is found.

FIG. 9A shows that here again initially a r.f. pulse, namely a 90° r.f. pulse 40, is irradiated on the proton side. While the first 90° r.f. pulse 40 is irradiated on the proton side, a disk gradient 41, followed by a trim gradient 42 are irradiated in the x direction, a sequence consisting of a trim gradient 43, a disk gradient 44 and another trim gradient 45 are exerted in the y direction, and a trim gradient 51, a disk gradient 52 and another trim gradient 53 are exerted in the z direction.

A first multiple-quantum transfer is then effected by a 90° r.f. pulse 46 that is irradiated on the $^{13}C$ side and that is disk-selective due to the disk gradient 44, while the following multiple-quantum retransfer is effected by another 90° r.f. pulse 49 which is irradiated on the $^{13}C$ side and which is disk-selective due to the disk-gradient 52. The subsequent time interval $\tau_3$ before the commencement of the echo 3 is usually as long as the first time interval $\tau_1$.

This case also provides the advantage that the phase position of the r.f. pulse 49 can be selected at desire because the multiple-quantum state has been dephased before by the spoil gradients 47, 48.

The generation of stimulated echoes of uncoupled protons is prevented in the proton interval by asymmetrical gradients.

FIG. 9A shows that during the $^{13}C$ interval of the duration $\tau_2$, two spoil gradients 47, 48 are exerted upon the sample in time symmetry to the 180° r.f. pulse 50, the two spoil gradients 47, 48 being homopolar. Due to the gyromagnetic ratio of $^{13}C$, which is smaller by the factor four compared with protons, the gradients in the $\tau_2$ interval must be greater by the factor four, this being indicated by the four symbols "▲". Another spoil gradient 54 is positioned after the third 90° r.f. pulse 49 on the proton side in x direction.

The active surfaces of the gradient pulses 47, 48, 54 have again be dimensioned in such a way as to allow for the gyromagnetic ratios in the different quantum-states.

The 180° r.f. pulse 50, which can be selective with respect to the chemical shift, neutralizes on the one hand the effect of the spoil gradient 47, 48 on the protons, and refocuses in addition the influence of the chemical shift and of the magnetic field inhomogeneity, or rather the dephasing resulting therefrom. The proton side, therefore, is exactly in an undisturbed state at the end of the time interval $\tau_2$, which is a necessary precondition for isolated imaging of the A magnetization following the multiple-quantum retransfer. This is due to the fact that the multiple-quantum state always relates to both sides, in contrast to the polarization retransfer, which always effects only a single kind of nuclei ($^1H$ or $^{13}C$).

FIG. 9B illustrates a variant, with respect to the two $G_x$ spoil gradients 47 and 48, of the before-discussed pulse program according to FIG. 9A.

While in the case of the before-discussed pulse sequence according to FIG. 9A the two spoil gradients 47 and 48 exerted upon the sample were homopolar, and had each twice the surface of the additional spoil gradient 54, the variant according to FIG. 9A provides that the two spoil gradients 47' and 48' are antipolar and have only half the surface of the additional spoil gradient 54.

One makes use in this case of the theory that the spoil gradients 47 and 48, in combination with the 180° pulse 50, serve the purpose that everything that had been dephased before can now be rephased by the 180° pulse 50. Now, if the spoil gradients 47' and 48' are given different polarity, as in the case of the variant of FIG. 9B, this will have an effect only on the undesirable, uncoupled spins (of the water) which will be dephased in this way even more efficiently, namely by the factor 5, whereas the different polarity will have no effect on the desired coupled spins, which will not be affected thereby.

Due to the different polarity of the spoil gradients 47' and 48' in the pulse sequence variant according to FIG. 9B, it is necessary to make the surface smaller, i.e. to reduce it to half the surface of the additional spoil gradient 54.

Figure 10:
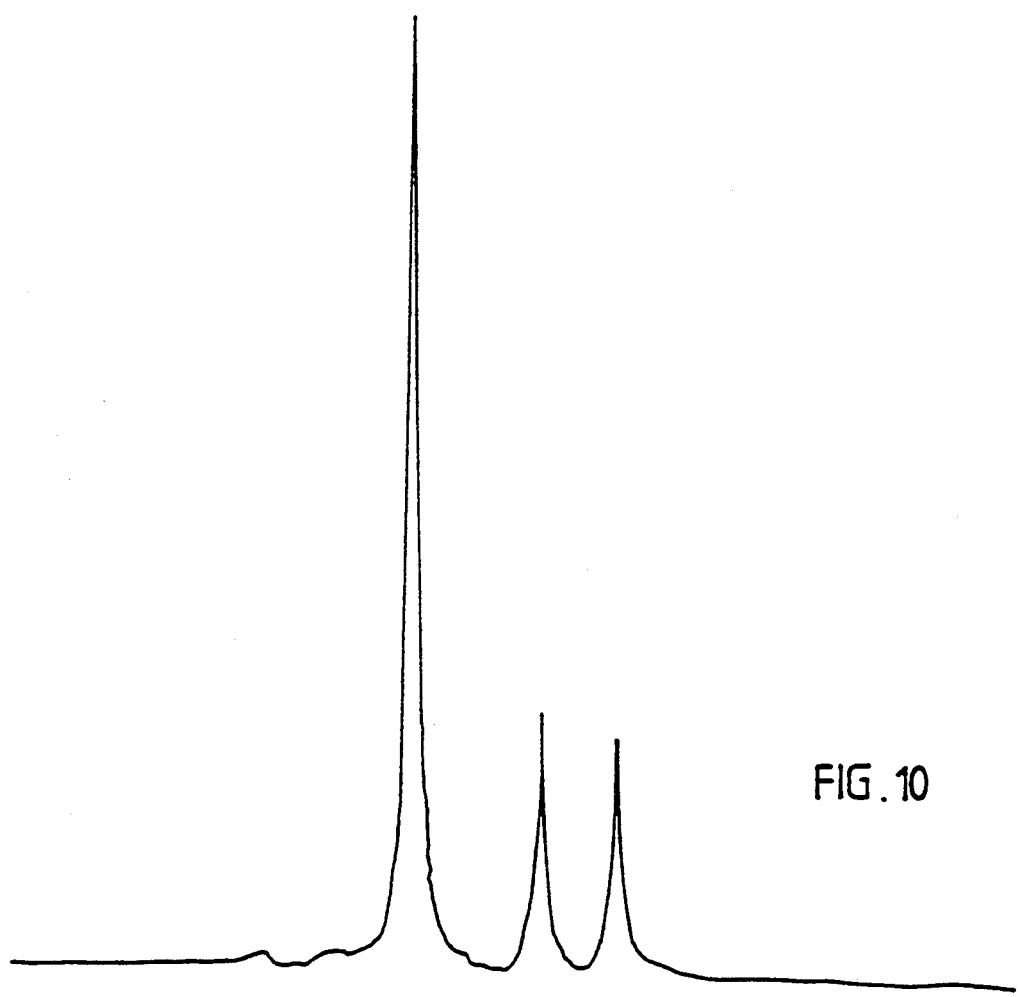
FIG. 10 shows a nuclear resonance spectrum recorded by a method of the prior art on a heteronuclear coupled system.

FIG. 10 shows a nuclear resonance spectrum where a sample similar to that of FIG. 4 has been used, with a ball having a volume of 1 cc was filled with $^{13}$C-enriched methanol and surrounded by water. The nuclear resonance spectrum of FIG. 10 was recorded from a single pass using a non-editing three-pulse sequence according to the prior art, at a magnetic field strength of 4.7 T.

Figure 11:
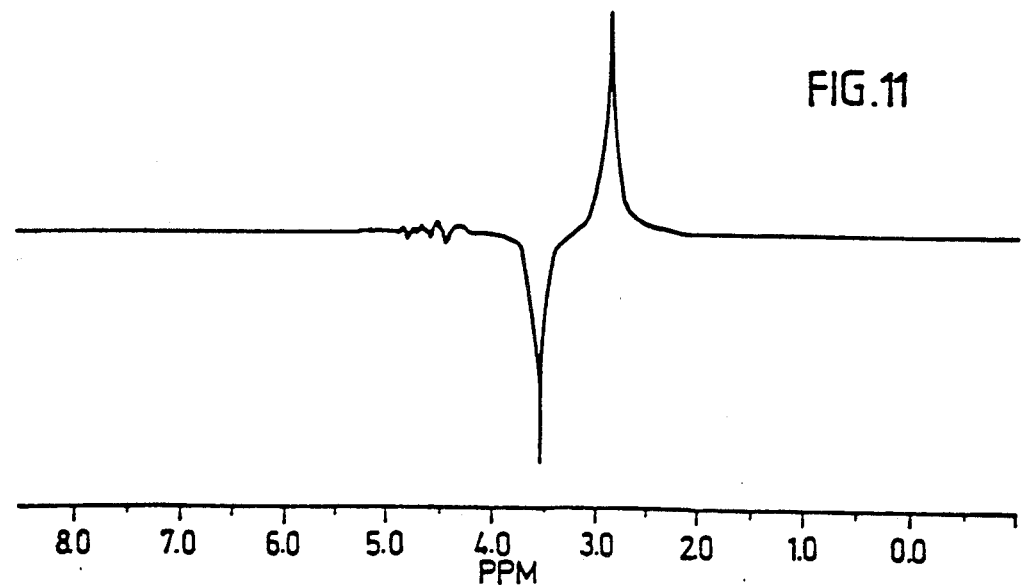
FIG. 11 shows a nuclear resonance spectrum similar to that of FIG. 10, but recorded with the aid of the method according to the invention as illustrated in FIG. 9.

In contrast, FIG. 11 shows a nuclear resonance spectrum recorded with the aid of a pulse sequence according to FIG. 9. It will be noted that the CH$_3$ signal at 3 ppm is approximately as high as that of FIG. 10, whereas the uncoupled spins at 4.7 ppm have practically disappeared.

Figure 12:
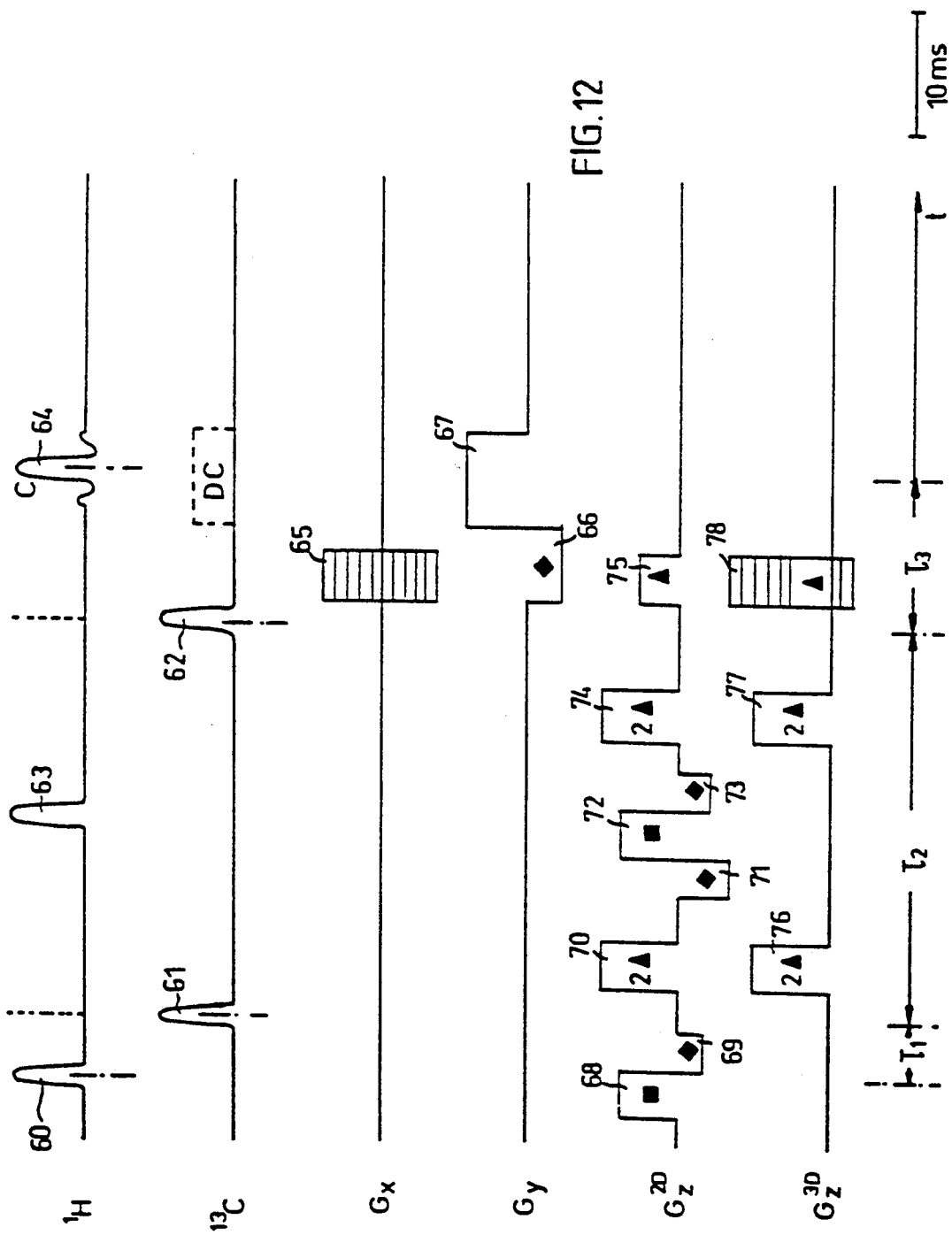
FIG. 12 shows a pulse program similar to that of FIG. 9, but for the case of two-dimensional or three-dimensional imaging methods.

FIG. 12 shows a pulse program similar to that of FIG. 9, for the case of two-dimensional or three-dimensional imaging.

The conditions on the r.f. side for the kinds of nuclei $^1$H and $^{13}$C are unchanged, i.e. one can see a first 90° r.f. pulse 60 on the proton side, a second 90° r.f. pulse 61 on the $^{13}$C side, a third 90° r.f. pulse 62 again on the $^{13}$C side and, in symmetry to the two the last-mentioned pulses 61, 62, i.e. in the middle of the $\tau$2 time interval, a 180° r.f. pulse 63 on the proton side. At 64 or at C, the echo can be seen at the end of the time interval $\tau$3.

In FIG. 12, it has been additionally indicated by DC on the $^{13}$C axis that decoupling can also be effected in the case of the experiments of the type of interest in this connection.

While a phase gradient 65 can be seen on the x axis, a trim gradient 66 and a read gradient 67 can be seen on the y axis.

In the z direction, FIG. 12 differentiates between the case of two-dimensional imaging and the case of three-dimensional imaging, by $G_{z2D}$ and $G_{z3D}$, respectively.

In the case of two-dimensional imaging, a sequence of disk, trim and spoil gradients 68 to 75 is applied in the z direction, as indicated by the symbols in FIG. 12 (compare the legend in FIG. 3).

In the case of three-dimensional imaging, two spoil gradients 76 and 77, as well as an additional phase gradient 78, are applied in the z direction.

The gradients applied in the z direction in the case of the pulse program of FIG. 12 replace the $G_x$ function described in connection with FIG. 9. Now, two-dimensional imaging is carried out in the $G^{Z2D}$ case, and three-dimensional imaging in the $G_z^{3D}$ case, by effecting a corresponding number of Fourier transformations, in the manner known as such.

Figure 13:
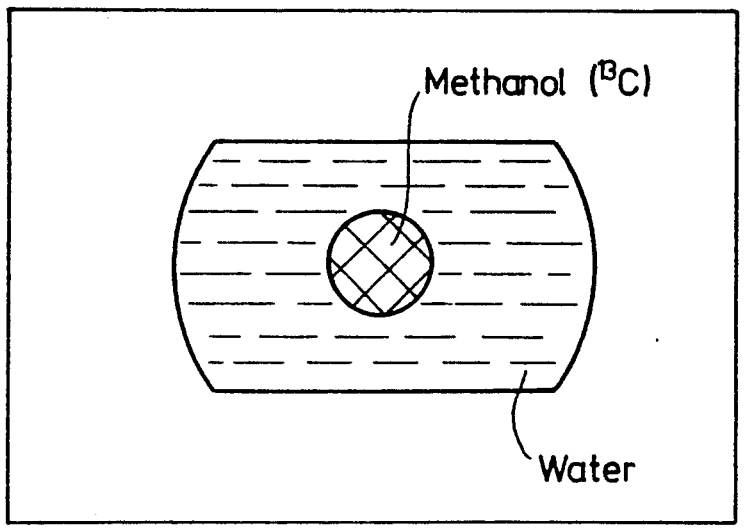
FIG. 13 shows a two-dimensional representation of a methanol ball with a natural $^{13}C$ content, in a water environment, that has been recorded by an imaging method according to the invention.
Figure 14:
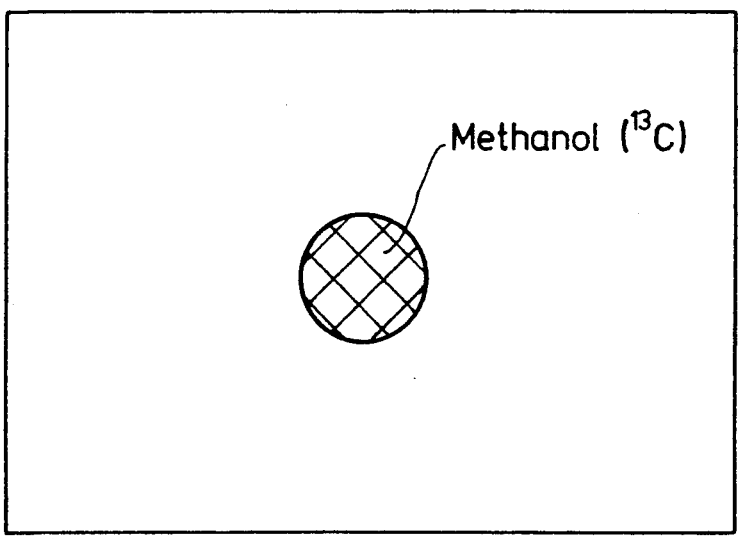
FIG. 14 shows the representation of FIG. 13, but recorded by the two-dimensional imaging method according to FIG. 12.

FIGS. 13 and 14 illustrate the effects of the imaging method according to the invention. FIG. 13 shows a conventional representation of a ball of pure methanol with natural $_{13}$C content in a water environment. The water environment is clearly recognizable as a rectangle. In contrast, FIG. 14 illustrates a measurement taken on the same object, but with the editing two-dimensional method according to FIG. 12, and it will be seen immediately that the water environment has been suppressed.

We claim:

1. A method of recording nuclear resonance spectra of test samples having at least a first, a second and a third group (A, B, X) of nuclei, said first group (A) of a first kind ($^1$H) of nuclei being coupled to said second group (X) of a second kind ($^{13}$C) of nuclei, while said third group (B) of said first kind ($^1$H) of nuclei is uncoupled to said second group (X), but has a chemical shift being substantially identical only to that of said first group (A), the method, for suppressing signals of said third group (B), for the purpose of obtaining isolated signals of said first group (A), comprises the steps of:

irradiating upon said sample a pulse sequence of a first, a second, a third and a fourth r.f. pulse; wherein said second r.f. pulse is applied such that the magnetization of the nuclei of said first group (A) belonging to said first kind ($^1$H) of nuclei is transferred to a state of multiple-quantum coherence by way of coherence transfer;

at least a first magnetic gradient field pulse of a predetermined pulse area is exerted upon said sample in a time interval ($\tau$2) between said second r.f. pulse and said fourth r.f. pulse, said first magnetic gradient field pulse being dephasing for the multiple-quantum coherence, with respect to the second group (X);

said third r.f. pulse is irradiated upon said sample in a time interval ($\tau$2) between said second r.f. pulse and said fourth r.f. pulse, said third r.f. pulse being refocusing for the multiple-quantum coherence, with respect to said first group (A);

said fourth r.f. pulse is adjusted such that the multiple-quantum coherence is re-transferred to a state of single-quantum coherence of the nuclei of said first group (A), by coherence re-transfer; and thereafter exerting upon said sample a second magnetic gradient field pulse being rephasing for the nuclei of said first group (A).

2. The method of claim 1, wherein said pulse area of said second magnetic gradient field pulse is k times the pulse area of said first magnetic gradient field pulse, k being the quotient of the gyromagnetic ratios of the nuclei of said two kinds of nuclei.

3. The method of claim 1, wherein two homopolar first magnetic gradient field pulses are exerted upon said sample.

4. The method of claim 1, wherein two antipolar first magnetic gradient field pulses are exerted upon said sample.

5. The method of claim 4, wherein the pulse area of said second magnetic gradient field pulse is 1/k times the pulse area of said first magnetic gradient field pulses, k being the quotient of the gyromagnetic ratios of the nuclei of said two kinds of nuclei.

6. The method of claim 1, wherein for slice-selective or volume-selective imaging, said sample is exposed to a sequence of magnetic gradient field pulses of different coordinate directions (x, y, z), at least one to three of said r.f. pulses being adjusted in a slice-selective manner.

7. The method of claim 1, wherein prior to irradiating said first 90° r.f. pulse, said sample is exposed to a r.f. pre-saturating pulse selective for the nuclei of said second group (X) and for uncoupled nuclei (H$_2$O), and is exposed thereafter to a magnetic gradient field pulse providing dephasing for the nuclei of said second group (X).

8. The method of claim 1, wherein said first and said second magnetic gradient field pulses are positioned on a time axis (t), relative to said r.f. pulses, such that no stimulated echos of uncoupled spins are generated.

9. The method of claim 1, wherein a time interval ($\tau_1$) between said first r.f. pulse and said second r.f. pulse is selected to be equal to an odd multiple of the reciprocal value of twice the coupling constant (J) between said first group (A) in said second group (X).

10. The method of claim 1, wherein for an $A_n$ X system a time interval $\tau_1$ between said first r.f. pulse and said second r.f. pulse is determined according to the formula:

$$\tau 1 = \frac{1}{\pi J} \text{ arc cot } \frac{1}{\pi J T_2}$$

wherein J is the coupling constant between said first group (A) and said second group (X) and $T_2$ is the transversal relaxation time.

11. The method of claim 1, wherein for an $A_n$ $X_2$ system a time interval $\tau_1$ between said first r.f. pulse and said second r.f. pulse is determined according to the formula:

$$\tau 1 = \frac{1}{\pi J} \text{ arc cot } \frac{1}{\pi J T_2}$$

wherein J is the coupling constant between said first group (A) and said second group (X) and $T_2$ is the transversal relaxation time.

12. The method of claim 6, wherein imaging of said sample is effected.

13. The method of claim 6, wherein a magnetic gradient field pulse is applied simultaneously with the application of one of said slice-selective r.f. pulses irradiated upon the nuclei of said second kind of nuclei ($^{13}$C), for imaging a section from an object being measured.

14. The method of claim 6, wherein one of said slice-selective r.f. pulses irradiated upon the nuclei of said second kind of nuclei ($^{13}$C) is adjusted to be selective with respect to the chemical shift.

15. A method of recording spin resonance spectra of test samples having at least a first, a second and a third group of spins (A, B, X), said first group (A) of spins being coupled to said second group (X), while said third group (B) is uncoupled to said second group (X) but is associated to a signal having a spectral position substantially identical only to that of said first group (A), the method, for suppressing signals of said third group (B) for the purpose of obtaining isolated signals of said first group (A), comprises the steps of:

irradiating upon said sample a pulse sequence of a first, a second and a third r.f. pulse, preferably 90° r.f. pulses; wherein at least said second r.f. pulse is applied such that the magnetization of the spins of said first group (A) is transferred to a state of multiple-quantum coherence by way of coherence transfer;

at least a first magnetic gradient field pulse having a predetermined pulse area, and being dephasing for the multiple-quantum coherence, is exerted upon said sample following said second r.f. pulse;

at least another one of said r.f. pulses is adjusted such that the multiple-quantum coherence is then re-transferred to the single-quantum coherence by way of coherence retransfer; and finally exerting upon the sample a second magnetic gradient field pulse being rephasing for the spins of said first group, the pulse area of said second magnetic gradient field pulse being k times the pulse area of said first magnetic gradient field pulse, k being preferably the quotient of the gyromagnetic ratios of the involved spins.

16. The method of claim 1, wherein said first, said second, and said third r.f. pulses are 90° pulses and said fourth r.f. pulse is a 180° pulse.

17. The method of claim 4, wherein the pulse area of said second magnetic gradient field pulse is one half the pulse area of said first magnetic gradient field pulses.

* * * * *